(12) United States Patent
Murugan et al.

(10) Patent No.: US 12,266,596 B2
(45) Date of Patent: Apr. 1, 2025

(54) SEMICONDUCTOR DEVICE WITH A POWER CONVERTER MODULE CONNECTED TO CONNECTION ASSEMBLY

(71) Applicant: TEXAS INSTRUMENTS INCORPORATED, Dallas, TX (US)

(72) Inventors: Rajen Manicon Murugan, Dallas, TX (US); Yiqi Tang, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 167 days.

(21) Appl. No.: 17/227,722

(22) Filed: Apr. 12, 2021

(65) Prior Publication Data

US 2022/0028770 A1    Jan. 27, 2022

Related U.S. Application Data

(60) Provisional application No. 63/056,302, filed on Jul. 24, 2020.

(51) Int. Cl.
 *H01L 23/498* (2006.01)
 *H01L 21/48* (2006.01)
 *H02M 1/00* (2007.01)

(52) U.S. Cl.
 CPC .... *H01L 23/49822* (2013.01); *H01L 21/4825* (2013.01); *H01L 23/49838* (2013.01); *H02M 1/0067* (2021.05)

(58) Field of Classification Search
 CPC ........... H01L 23/49822; H01L 21/4825; H01L 23/49838; H02M 1/0067
 See application file for complete search history.

(56) References Cited

U.S. PATENT DOCUMENTS

| | | | |
|---|---|---|---|
| 7,259,972 B2 | 8/2007 | Yang | |
| 9,077,335 B2 | 7/2015 | Hughes et al. | |
| 9,281,748 B2 | 3/2016 | Barnette et al. | |
| 10,141,841 B1 | 11/2018 | Ongaro et al. | |
| 10,924,011 B2 | 2/2021 | Parto | |
| 2017/0194239 A1* | 7/2017 | Ryu | H01L 23/50 |
| 2020/0066627 A1* | 2/2020 | Do | H01L 23/5226 |
| 2020/0066692 A1* | 2/2020 | Wolter | H01L 23/00 |
| 2020/0066830 A1* | 2/2020 | Bharath | H01L 23/5226 |
| 2020/0411418 A1 | 12/2020 | Tang et al. | |
| 2021/0273036 A1* | 9/2021 | Marin | H01L 21/4857 |

\* cited by examiner

*Primary Examiner* — Michael Jung
(74) *Attorney, Agent, or Firm* — Ronald O. Neerings; Frank D. Cimino

(57) ABSTRACT

A semiconductor device includes a die with a power converter module. The power converter module includes an output port and a return port. The semiconductor device also includes a connection assembly that includes pads configured to be coupled to circuit components of a printed circuit board (PCB). The connection assembly also includes a first layer patterned to include a first trace that is coupled to one of the output port and the return port and a second trace that is coupled to the other of the output port and return port. A second layer of the connection assembly is patterned to provide a first via between the first trace and a third layer and a second via between the first trace and the third layer. The third layer is patterned to provide a portion of a first conductive path and a portion of a second conductive path.

23 Claims, 10 Drawing Sheets

SEMICONDUCTOR DEVICE WITH A POWER CONVERTER MODULE CONNECTED TO CONNECTION ASSEMBLY

CROSS-REFERENCE TO RELATED APPLICATION

This application claims the benefit of priority to U.S. Provisional Application No. 63/056,302 filed on 24 Jul. 2020, the entirety of which is incorporated herein by reference.

TECHNICAL FIELD

This disclosure relates to semiconductor devices. More particularly, this disclosure relates to a semiconductor device that includes a power converter module.

BACKGROUND

In electrical engineering, power conversion is the process of converting electric energy from one form to another. A power converter is an electrical device that can convert electrical energy. Some power converters convert alternating current (AC) into direct current (DC). Other power converters, namely a DC-to-DC power converter converts a source of DC from one voltage level to another voltage level.

A buck converter, also referred to as a step-down converter, is a DC-to-DC converter that steps down voltage (while stepping up current) from an input port (supply) to an output port (coupled to a load). A boost converter, also referred to as a step-up converter, is a DC-to-DC power converter that steps up voltage (while stepping down current) from an input port (supply) to an output port (coupled to a load). A buck converter and a boost converter are both forms of a switched mode power supply.

Flat no-leads packages including quad-flat no-leads (QFN) are mountable on to a printed circuit board (PCB) to electrically connect integrated circuits. Flat no-leads, is a surface-mount technology, one of several package technologies that connect integrated circuit (IC) chips to a surface of a PCB without through-holes. Flat no-lead includes a near chip scale plastic encapsulated package (molding) made with a planar copper lead frame substrate. Perimeter pads (lands) on the package bottom provide electrical connections to the PCB.

SUMMARY

A first example relates to a semiconductor device that includes a die including a power converter module. The power converter module includes an output port and a return port. The semiconductor device also includes a connection assembly that includes pads configured to be coupled to circuit components of a printed circuit board (PCB). The connection assembly also includes a first layer patterned to include a first trace that is coupled to one of the output port and the return port of the power converter module and a second trace that is coupled to the other of the output port and return port of the power converter module. The connection assembly further includes a second layer patterned to provide a first via between the first trace and a third layer of the connection assembly and a second via between the first trace and the third layer of the connection assembly. The third layer of the connection assembly being patterned to provide a portion of a first conductive path between the first via and a first pad of the pads and a portion of a second conductive path between the second via and a second pad of the pads.

A second example relates to a method for forming a semiconductor device. The method includes forming a connection assembly with layers that includes dielectric distributed throughout the connection assembly, wherein the layers form a first electrical path between a first trace and a first pad of pads of the connection assembly and a second electrical path between a second trace and a second pad of the pads of the connection assembly. The method also includes mounting a die to the connection assembly. The die includes a power converter module that includes an output port and a return port at a surface of the die. The output port is configured to be coupled to the first trace of the connection assembly. The return port being configured to be coupled to the second trace of the connection assembly. At least one of the first electrical path and the second electrical path of the connection assembly extend in a direction normal to a surface of the die for a distance greater than a thickness of a single layer of the connection assembly.

DETAILED DESCRIPTION

This disclosure relates to a semiconductor device, such as an IC package that includes a die with a power converter module. The power converter module includes an output port and a return port. The die is adhered to a connection assembly, such as multi-layer package substrate that forms a first electrical path between the output port of the power converter module and a first pad of the multi-layer package substrate. The multi-layer package substrate also forms a second electrical path between the return port of the power converter module and a second pad of the multi-layer package substrate. The IC chip can be mounted on a printed circuit board (PCB) that completes a circuit path between the output port and the return port of the power converter module. The area circumscribed by the circuit path between the output port and the return port of the power converter module defines a loop area. The greater the loop area, the greater the parasitic inductance of the power converter module. Thus, the multi-layer package substrate is fabricated to curtail the loop area, which in turn curtails the parasitic inductance of the power converter module, thereby curtailing the electromagnetic interference (EMI) induced by operation of the power converter module.

To curtail the loop area, geometries of the first electrical path and the second electrical path are selected. More particularly, in one example, the first electrical path and the second electrical path extend linearly through the multi-layer package substrate. In another example, the first electrical path extends linearly through two layers of the multi-layer package substrate to a third layer of the multi-layer package substrate, and the second electrical path extends linearly through the multi-layer package substrate. In either situation, the loop area is reduced relative to a conventional lead frame employed for quad flat no leads (QFN) processing that is limited to two layers.

Figure 1:
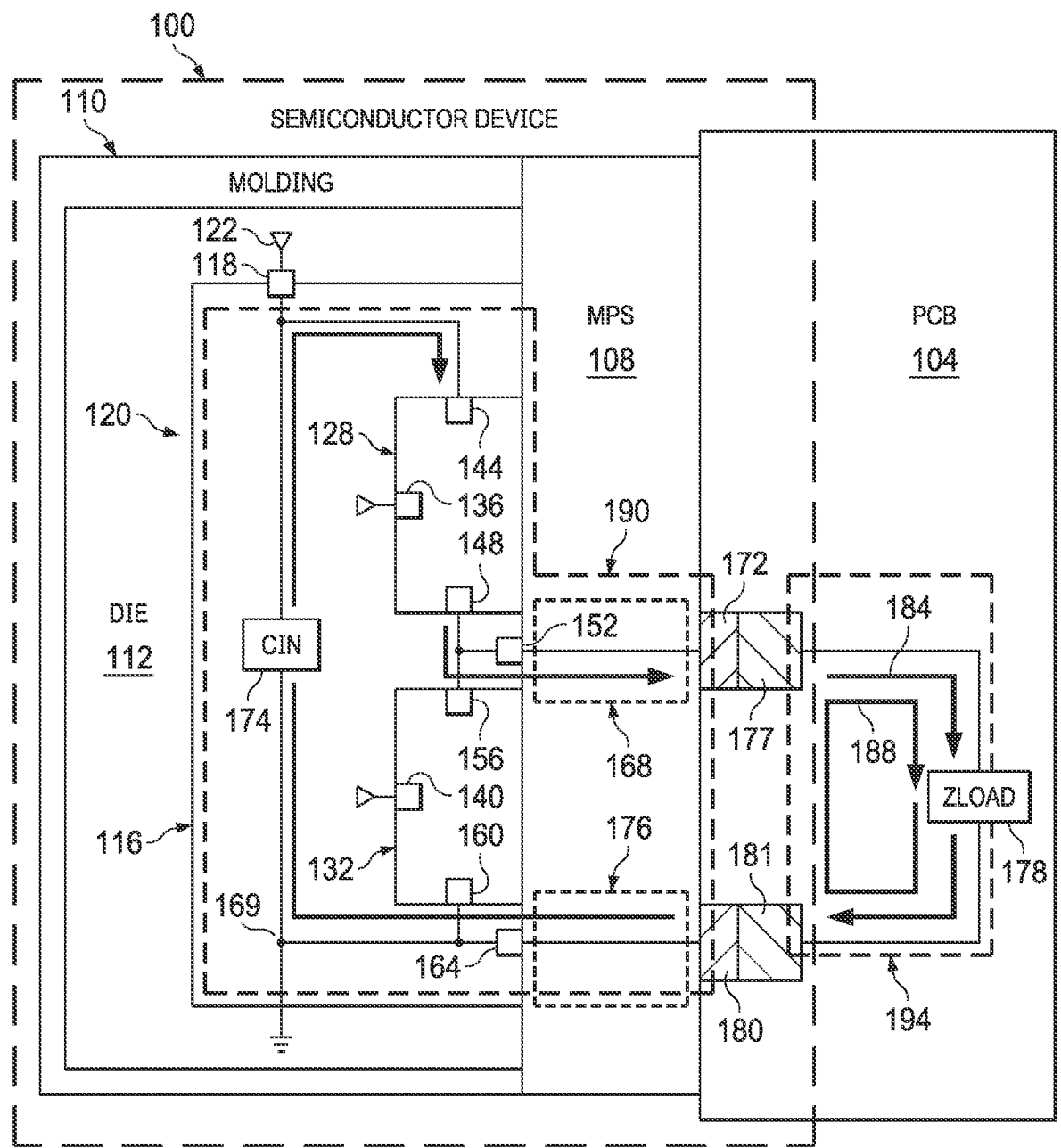
FIG. 1 illustrates a diagram of an example of a semiconductor device mounted with a power converter module on a printed circuit board (PCB).

FIG. 1 illustrates a diagram of an example of a semiconductor device 100 mounted on a printed circuit board (PCB) 104. The semiconductor device 100 can be implemented, for example, as an integrated circuit (IC) package. The semiconductor device 100 includes a multi-layer package substrate 108 (labeled MPS in the FIGS.), such as a multi-layer package substrate QFN. Moreover, a die 112 of the semiconductor device 100 is mounted on the multi-layer package substrate 108 and encapsulated in a molding 110 (e.g., plastic). In the examples provided, the multi-layer package substrate 108 is employed as a type of connection assembly for connecting the die 112 to the PCB 104. In other examples, other types of connection assemblies are employable in place of the multi-layer package substrate 108.

The die 112 includes modules for implementing electrical operations. In particular, the die 112 includes a power converter module 116. As one example, the power converter module 116 is an AC-to-DC converter. As another example, the power converter module 116 is a DC-to-DC converter, such as a buck converter (a step-down converter) or a boost converter (a step-up converter). For the examples provided, it is presumed that the power converter module 116 is a DC-to-DC converter.

For purposes of illustration, a circuit diagram 120 is included to illustrate the flow of current through the semiconductor device 100 and the PCB 104. The circuit diagram 120 includes a voltage source 122 coupled to an input port 118 of the power converter module 116. The power converter module 116 includes a high side transistor 128 and a low side transistor 132. In some examples, the high side transistor 128 and the low side transistor 132 are implemented as field effect transistors (FETs), such as N-channel metal oxide semiconductor field effect transistors (NMOSs). In other examples, the high side transistor 128 and the low side transistor 132 are implemented as bipolar junction transistors (BJTs), such as NPN transistors. In still other examples, other transistors are employable. Furthermore, although semiconductor device 100 illustrates a single high side transistor 128 and a single low side transistor 132, in other examples, the high side transistor 128 and the low side transistor 132 both represents a plurality of respective high side and low side transistors connected back-to-back or in an array (e.g., connected in parallel).

A control node 136 (e.g., a gate or a base) of the high side transistor 128 is driven by a first control signal, and a control node 140 of the low side transistor 132 is driven by a second control signal. The first control signal and the second control signal are complementary signals.

An input node 144 (e.g., drain or a collector) of the high side transistor 128 is coupled to the input port 118. An output node 148 (e.g., a source or an emitter) of the high side transistor 128 is coupled to an output port 152 of the power converter module 116. Moreover, the output node 148 of the high side transistor 128 is coupled to an input node 156 (e.g., a drain or collector) of the low side transistor 132. An output node 160 of the low side transistor 132 is coupled to a return port 164 of the power converter module 116. The return port 164 is also coupled to an electrically neutral node (e.g., ground) 169. An input capacitance 174 (labeled CIN) represents a parasitic capacitance between the return port 164 and the input port 118.

The multi-layer package substrate 108 is designed to provide a first electrical path 168 between the output port 152 of the power converter module 116 and a first pad 172 of the multi-layer package substrate 108. The multi-layer package substrate 108 is also designed to provide a second electrical path 176 between the return port 164 of the power converter module 116 and a second pad 180 of the multi-layer package substrate 108.

The first pad 172 of the multi-layer package substrate 108 is coupled to a first terminal 177 of a load 178, labeled ZLOAD, and the second pad 180 is coupled to a second terminal 181 of the load 178, thereby completing a circuit path between the output port 152 and the return port 164 of the power converter module 116. The load 178 represents an impedance load, such as a combination of inductors, capacitors and resistors. Moreover, the load 178 provides a conductive path between the first pad 172 and the second pad 180 of the multi-layer package substrate 108.

In operation of the power converter module 116, the first and second control signals control a switching state of the high side transistor 128 and the low side transistor 132, respectively. Moreover, the first and second control signals are set such that if the high side transistor 128 is turned on (e.g., operating in a linear mode of operation), the low side transistor 132 is turned off (e.g., operating in a cut-off mode of operation). In this state, the high side transistor 128 being turned on and the low side transistor 132 being turned off, current flows along a path marked as a first current loop 184. Conversely, when the first and second control signals cause the high side transistor 128 to turn off (e.g., operate in the cut-off mode) and the low side transistor 132 to turn on (e.g., operate in the linear mode), energy stored at the load 178 is released (e.g., from an inductor) thereby causing current to flow along a path marked as a second current loop 188.

Operation of the power converter module 116 induces electromagnetic interference (EMI). The EMI is induced from a relatively high current transient (di/dt) and/or a relatively high voltage transient (dv/dt) that occurs during operation of the power converter module 116. More particularly, current flowing through the first current loop 184 and the second current loop 188 induce EMI due to parasitic inductances, such as a parasitic inductance of the first electrical path 168 and the second electrical path 176. Moreover, the EMI is proportional to an area circumscribed by the corresponding current loop. Thus, the first current loop 184 induces EMI at a greater level than the second current loop 188.

The area circumscribed by the first current loop 184 can be partitioned into two areas, namely a first area 190 that includes an area within the semiconductor device 100, and a second area 194 that includes an area on the PCB 104. Thus, curtailing a size of the first area 190 reduces the EMI induced by the first current loop 184.

To curtail the size of the first area 190, geometries of the first electrical path 168 and the second electrical path 176 are selected to provide an efficient conductive path that diminishes the size of the first area 190. As illustrated, the shorter the first electrical path 168 and/or the second electrical path 176, the smaller the first area 190, thereby curtailing the parasitic inductance and the EMI of the first current loop 184.

The geometries of the first electrical path 168 and the second electrical path 176 leverage the multiple layers provided by the multi-layer package substrate 108. In some examples, the multi-layer package substrate 108 includes four (4) layers, but in other examples, the multi-layer package substrate 108 has more than four (4) layers. In some examples, a first layer of the multi-layer package substrate 108 is patterned such that the first electrical path 168 includes a first trace that is coupled to the output port 152 of the power converter module 116. Additionally, the first layer of the multi-layer package substrate 108 is patterned such that the second electrical path 176 includes a second trace that is coupled to the return port 164 of the power converter module 116. Additionally, the multi-layer package substrate 108 includes a second layer patterned such that the first electrical path 168 provides a first via between the first trace and a third layer of the multi-layer package substrate 108. Moreover, the second layer of the multi-layer package substrate 108 is patterned such that the second electrical path 176 provides a second via between the first trace and the third layer of the multi-layer package substrate 108. Further, the third layer of the multi-layer package substrate 108 is patterned such that the first electrical path 168 provides a first conductive path (e.g., a trace and/or a via) between the first via and the first pad 172. Additionally, the third layer of the multi-layer package substrate 108 is patterned such that the second electrical path 176 provides a second conductive path (e.g., traces and/or a via) between the second via and the second pad 180.

There are several different geometries available for the first electrical path 168 and the second electrical path 176. In some examples, the first electrical path 168 and the second electrical path 176 are parallel, and substantially linear extending in a direction normal from a surface of the die 112. In other examples, the first electrical path includes a trace at the third layer of the multi-layer package substrate 108 that extends in a direction parallel to the surface of the die 112.

In any such example, the multiple layers (e.g., four (4) or more layers) of the multi-layer package substrate 108 enable geometries for the first electrical path 168 and the second electrical path 176 that are not available in a conventional two-layer QFN lead frame. Thus, the first electrical path 168 and the second electrical path 176 are provided to diminish the size of the first area 190 to curtail EMI caused by operation of the power converter module 116.

Figure 2:
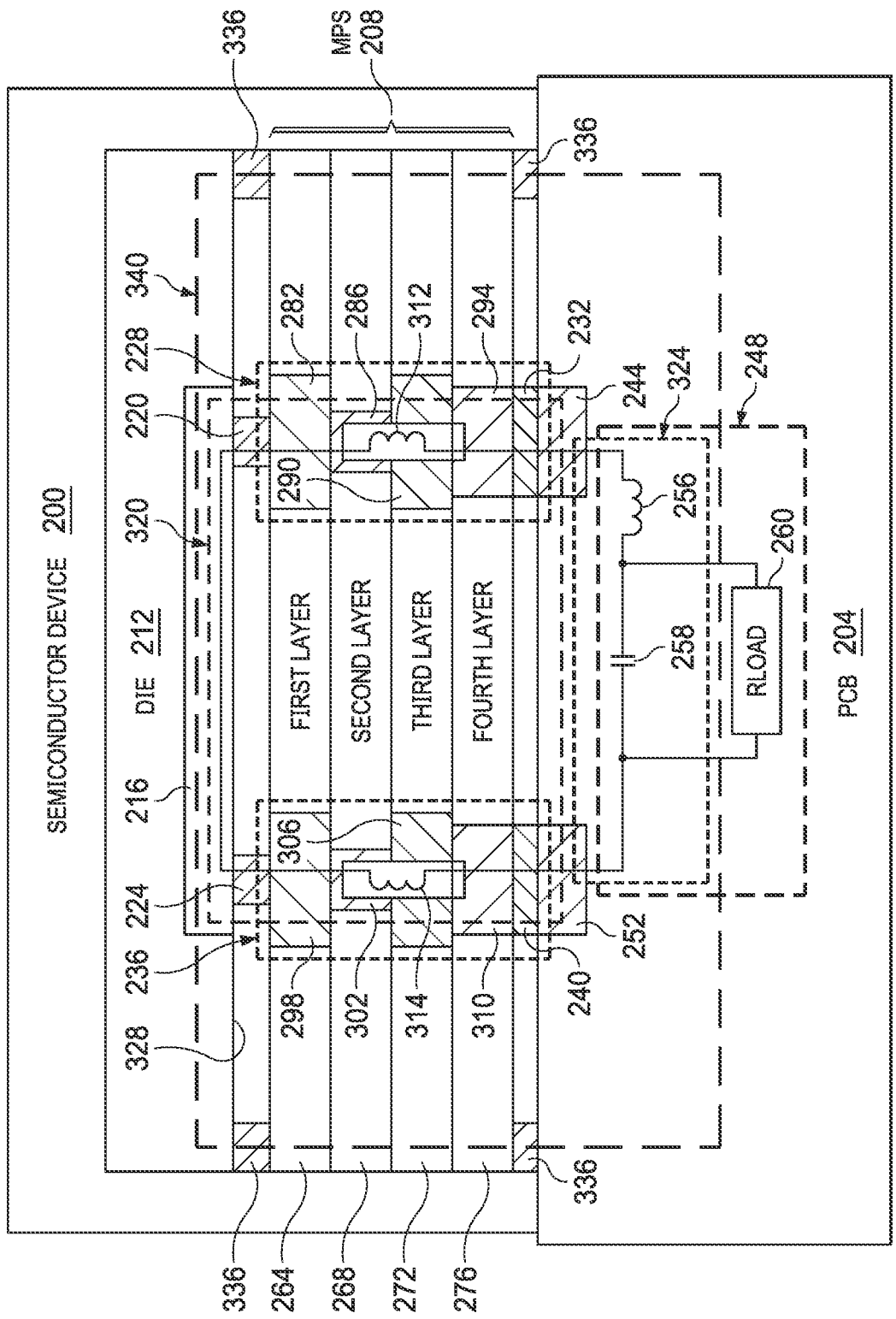
FIG. 2 illustrates another diagram of an example of a semiconductor device mounted with a power converter module on a PCB.

FIG. 2 illustrates a diagram of an example of a semiconductor device 200 mounted on a PCB 204. The semiconductor device 200 is employable to implement the semiconductor device 100 of FIG. 1, and the PCB 204 is employable to implement the PCB 104 of FIG. 1. The semiconductor device 200 can be implemented, for example, as an IC package. The semiconductor device 200 includes a multi-layer package substrate 208, such as a multi-layer package substrate QFN. Moreover, a die 212 of the semiconductor device 200 is mounted on the multi-layer package substrate 208.

The die 212 includes modules for implementing electrical operations. In particular, the die 212 includes a power converter module 216. As one example, the power converter module 216 is an AC-to-DC converter. As another example, the power converter module 216 is a DC-to-DC converter, such as a buck converter (a step-down converter) or a boost converter (a step-up converter). For the examples provided, it is presumed that the power converter module 216 is a DC-to-DC converter.

The power converter module 216 includes an output port 220 and a return port 224 that can correspond respectively to the output port 152 and the return port 164 of FIG. 1. A first electrical path 228 of the multi-layer package substrate 208 is coupled to the output port 220 of the power converter module 216 and provides a conductive electrical path between the output port 220 and a first pad 232 of the multi-layer package substrate 208. Moreover, a second electrical path 236 of the multi-layer package substrate 208 is coupled to the return port 224 of the power converter module 216 and provides a conductive path between the return port 224 and a second pad 240 of the multi-layer package substrate 208.

As noted, the semiconductor device 200 is mounted on the PCB 204. More particularly, the semiconductor device 200 is mounted such that the first pad 232 of the multi-layer package substrate 208 is coupled to a first terminal 244 of a load 248 on the PCB 204 and the second pad 240 of the multi-layer package substrate is coupled to a second terminal 252 of the load 248. The load 248 represents circuit components to which power is provided from the power converter module 216. The load 248 includes an inductor 256 connected in series with a parallel connection between a capacitor 258 and a resistive load 260. The load 248 can be employed to implement the load 178 of FIG. 1. The inductor 256 can be referred to as a load inductor. Moreover, the resistive load 260 can be represented as a resistor. Additionally, in various examples, the resistive load 260 is implemented as a combination of capacitive resistive and inductive components, or some subset thereof. Furthermore, the architecture of the load 248 changes based on the type of power converter (e.g., buck converter, boost converter, AC-to-DC converter, etc.) selected as the power converter module 216.

The multi-layer package substrate 208 includes four layers, a first layer 264, a second layer 268, a third layer 272 and a fourth layer 276. The first electrical path 228 includes a first trace 282 formed on the first layer 264 of the multi-layer package substrate 208. The first electrical path 228 also includes a first via 286 that provides a conductive path between the first trace 282 and a second trace 290 of the first electrical path 228 on the third layer 272 of the multi-layer package substrate 208. The first electrical path 228 still further includes a second via 294 that provides a conductive path between the second trace 290 and the first pad 232 of the multi-layer package substrate 208. Moreover, the second trace 290 provides a portion of a conductive path between the first via 286 and the first pad 232.

The layers of the multi-layer package substrate 208 have thicknesses that vary based on the selected application of the semiconductor device 200. However, a combination of two layers of the multi-layer package substrate 208 are thicker than a single layer of the multi-layer package substrate 208. For instance, the first layer 264 and the second layer 268 have a combined thickness that is greater than the thickness of the third layer 272.

The second electrical path 236 includes a third trace 298 formed on the first layer 264 of the multi-layer package substrate 208. The second electrical path 236 also includes a third via 302 that provides a conductive path between the third trace 298 and a fourth trace 306 of the second electrical path 236 on the third layer 272 of the multi-layer package substrate 208. The second electrical path 236 still further includes a fourth via 310 that provides a conductive path between the fourth trace 306 and the second pad 240 of the multi-layer package substrate 208. Moreover, the fourth trace 306 provides a portion of a conductive path between the third via 302 and the second pad 240. The first electrical path 228 and the second electrical path 236 induce a first parasitic inductance 312 and a second parasitic inductance 314, respectively.

In operation, a current loop (e.g., corresponding to the first current loop 184 of FIG. 1) circumscribes a first area 320 and a second area 324. The first area 320 corresponds to the first area 190 of FIG. 1, such that the first area 320 represents the portion of the current loop within the semiconductor device 200. The size of the first area 320 and the second area 324 combined is proportional to an amount of EMI induced by operation of the power converter module 216.

To diminish the area of the first area 320 (which reduces the area of the current loop), geometries for the first electrical path 228 and the second electrical path 236 are selected to form a substantially linear path from the output port 220 of the power converter module 216 to the first pad 232 of the multi-layer package substrate 208 and from the second pad 240 of the multi-layer package substrate 208 to the return port 224 of the power converter module 216. More particularly, the first electrical path 228 and the second electrical path 236 extend in a direction normal (perpendicular) to a surface 328 of the die 212, such that the first electrical path 228 and the second electrical path 236 are parallel in some examples. Providing substantially linear paths for the first electrical path 228 and the second electrical path 236 curtails the first parasitic inductance 312 and the second parasitic inductance 314, which improves the overall performance of the power converter module 216.

In some examples, to further diminish the first area 320, the first pad 232 and the second pad 240 are implemented as island pads. An island pad (alternatively referred to as a stand-alone pad) refers to a pad that does not intersect a perimeter of the multi-layer package substrate 208. Stated differently, an island pad is spaced apart from the perimeter of the multi-layer package substrate 208.

Figure 3:
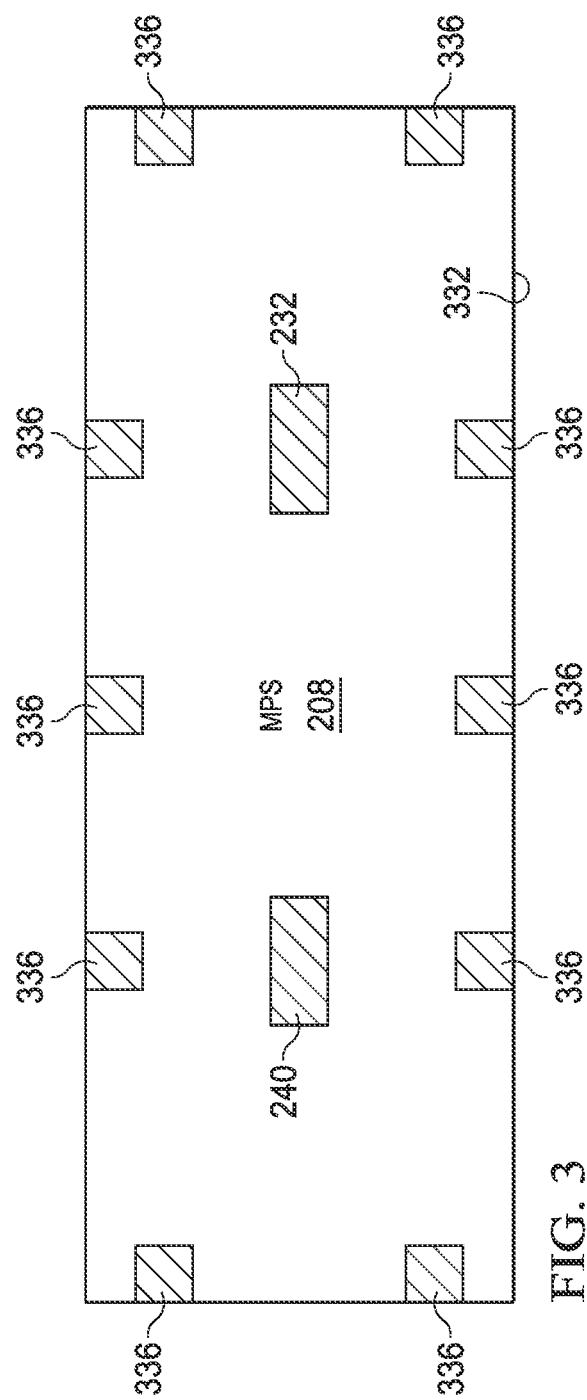
FIG. 3 illustrates an example of a view of a multi-layer package substrate.

FIG. 3 illustrates a surface view of the multi-layer package substrate 208 of FIG. 2. The surface of the multi-layer package substrate 208 illustrated in FIG. 3 represents a surface that mounts on the PCB 204 of FIG. 2. For purposes of simplification of explanation, FIGS. 2 and 3 employ the same reference numbers to denote the same structure. The multi-layer package substrate 208 includes the first pad 232 and the second pad 240 positioned as island pads that do not intersect (spaced apart from) a perimeter 332 of the multi-layer package substrate 208, in contrast to the pads 336. The placement of the pads, as illustrated in FIG. 3, including the first pad 232 and the second pad 240 is one example. In other examples, some of the pads, including the first pad 232 and the second pad 240 are larger or smaller than as illustrated. For instance, in some examples the first pad 232 and/or the second pad 240, extends from a center region of the multi-layer package substrate 208 to a region that intersects the perimeter 332.

Referring back to FIG. 2, in some examples, the first pad 232 and/or the second pad 240 can extend from a center region of the multi-layer package substrate 208 to the perimeter 332 of the multi-layer package substrate 208 in increase current flow during operation of the power converter module 216. As illustrated, by positioning the first terminal 244 and the second terminal 252 to match the position of the first pad 232 and the second pad 240, respectively, the second area 324 is also diminished, further curtailing the EMI caused by operation of the power converter module 216.

For purposes of comparison, a box 340 that approximates an area of a loop current employing conventional techniques is included. The box 340 traverses the pads 336 that are positioned along the perimeter 332 of the multi-layer package substrate 208. As illustrated, the area circumscribed by the box 340 is significantly larger than the combination of the first area 320 and the second area 324. Thus, by implementing the multi-layer package substrate 208, the first area 320, and in some examples, the second area 324 is diminished, such that the EMI inducted by operation of the power converter module 216 is curtailed.

Figure 4:
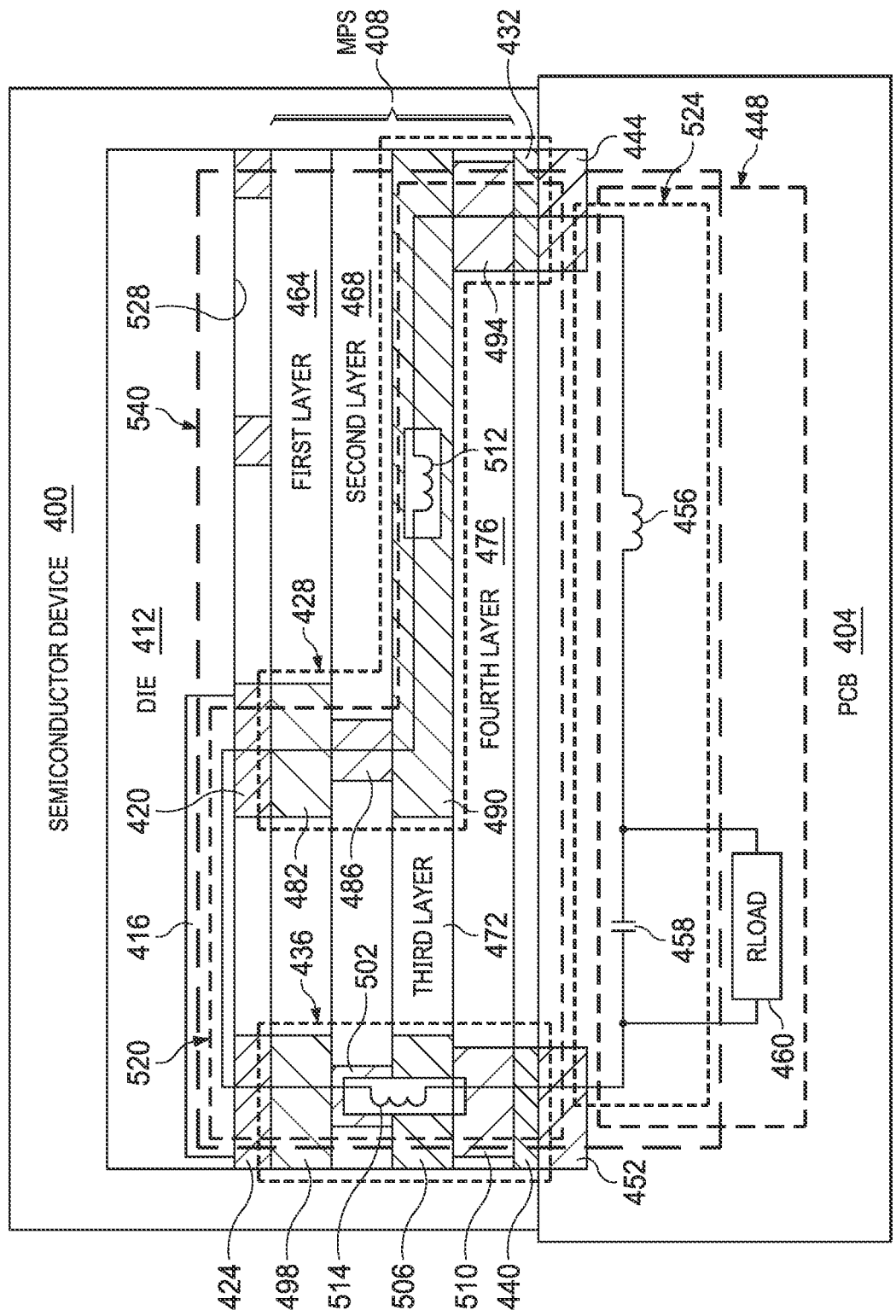
FIG. 4 illustrates yet another diagram of an example of a semiconductor device mounted with a power converter module on a PCB.

FIG. 4 illustrates a diagram of another example of a semiconductor device 400 mounted on a PCB 404. The semiconductor device 400 is employable to implement the semiconductor device 100 of FIG. 1, and the PCB 404 is employable to implement the PCB 104 of FIG. 1. The semiconductor device 400 can be implemented, for example, as an IC chip. The semiconductor device 400 includes a multi-layer package substrate 408, such as a multi-layer package substrate QFN. Moreover, a die 412 of the semiconductor device 100 is mounted on the multi-layer package substrate 108.

The die 412 includes modules for implementing electrical operations. In particular, the die 412 includes a power converter module 416. As one example, the power converter module 416 is an AC-to-DC converter. As another example, the power converter module 416 is a DC-to-DC converter, such as a buck converter (a step-down converter) or a boost converter (a step-up converter). For the examples provided, it is presumed that the power converter module 416 is a DC-to-DC converter.

The power converter module 416 includes an output port 420 and a return port 424 that can correspond respectively to the output port 152 and the return port 164 of FIG. 1. A first electrical path 428 of the multi-layer package substrate 408 is coupled to the output port 420 of the power converter module 416 to provide a conductive electrical path between the output port 420 and a first pad 432 of the multi-layer package substrate 408. Moreover, a second electrical path 436 of the multi-layer package substrate 408 is coupled to the return port 424 of the power converter module 416 and provides a conductive path between the return port 424 and a second pad 440 of the multi-layer package substrate 408.

As noted, the semiconductor device 400 is mounted on the PCB 404. More particularly, the semiconductor device 400 is mounted such that the first pad 432 of the multi-layer package substrate 408 is coupled to a first terminal 444 of a load 448 on the PCB 404 and the second pad 440 of the multi-layer package substrate 408 is coupled to a second terminal 452 of the load 448. The load 448 represents circuit components to which power is provided from the power converter module 416. The load 448 includes an inductor 456 connected in series with a parallel connection between a capacitor 458 and a resistive load 460 (labeled RLOAD). The load 448 can be employed to implement the load 178 of FIG. 1. The inductor 456 can be referred to as a load inductor. Moreover, the resistive load 460 can be represented as a resistor. Additionally, in various examples, the resistive load 460 is implemented as a combination of capacitive resistive and inductive components, or some subset thereof. Furthermore, the architecture of the load 448 changes based on the type of power converter (e.g., buck converter, boost converter, AC to DC converter, etc.) selected as the power converter module 416.

The multi-layer package substrate 408 includes four layers, a first layer 464, a second layer 468, a third layer 472 and a fourth layer 476. The first electrical path 428 includes a first trace 482 formed on the first layer 464 of the multi-layer package substrate 408. The first electrical path 428 also includes a first via 486 that provides a conductive path between the first trace 482 and a second trace 490 of the first electrical path 428 on the third layer 472 of the multi-layer package substrate 408. The first electrical path 428 still further includes a second via 494 that provides a conductive path between the second trace 490 and the first pad 432 of the multi-layer package substrate 408.

The layers of the multi-layer package substrate 208 have thicknesses that are approximately (e.g., within 10%) equal. Thus, a combination of two layers of the multi-layer package substrate 208 is thicker than a single layer of the multi-layer package substrate 208. For instance, the first layer 464 and the second layer 468 have a combined thickness that is greater than the thickness of the third layer 472.

The second electrical path 436 includes a third trace 498 formed on the first layer 464 of the multi-layer package substrate 408. The second electrical path 436 also includes a third via 502 that provides a conductive path between the third trace 498 and a fourth trace 506 of the second electrical path 436 on the third layer 472 of the multi-layer package substrate 408. The second electrical path 436 still further includes a fourth via 510 that provides a conductive path between the fourth trace 506 and the second pad 440 of the multi-layer package substrate 408. Moreover, the fourth trace 506 provides a conductive path between the third via 502 and the fourth via 510. The first electrical path 428 and the second electrical path 436 provide a first parasitic inductance 512 and a second parasitic inductance 514, respectively.

In operation, a current loop (e.g., corresponding to the first current loop 184 of FIG. 1) circumscribes a first area 520 and a second area 524. The first area 520 corresponds to the first area 190 of FIG. 1, such that the first area 520 represents the portion of the current loop within the semiconductor device 400. The size of the first area 520 and the second area 524 combined is proportional to an amount of EMI induced by operation of the power converter module 416.

To diminish the area of the first area 520 (which reduces the area of the current loop), geometries for the first electrical path 428 and the second electrical path 436 are selected to form an L-shaped polygon (e.g., an irregular polygon). More particularly, the first electrical path 428 extends linearly from a direction normal to a surface 528 of the die 412 from the output port 420 to the second trace 490 for a distance that is greater than a thickness of the third layer 472 of the multi-layer package substrate 408. The second trace 490 provides an electrical path that extends in a direction parallel to the surface 528 from an interior region of the multi-layer package substrate 408 to a perimeter 532 of the multi-layer package substrate 408. Accordingly, the first pad 432 is situated at the perimeter 532 of the die 412. Additionally, the second electrical path 436 provides a substantially linear path from the second pad 440 of the multi-layer package substrate 408 to the return port 424 of the power converter module 416. More particularly, the second electrical path 436 extend in a direction normal (perpendicular) to the surface 528 of the die 412. Providing the geometries for the first electrical path 428 for the first electrical path 428 and the second electrical path 436 curtails the second parasitic inductance 514, which improves the overall performance of the power converter module 416.

For purposes of comparison, a box 540 that approximates an area of a loop current employing conventional techniques is included. The box 540 is a rectangular shape. As illustrated, the area circumscribed by the box 540 is larger than the combination of the first area 520 and the second area 524. Thus, by implementing the multi-layer package substrate 408, the first area 520 is diminished, such that the EMI inducted by operation of the power converter module 416 is curtailed.

Figure 5:
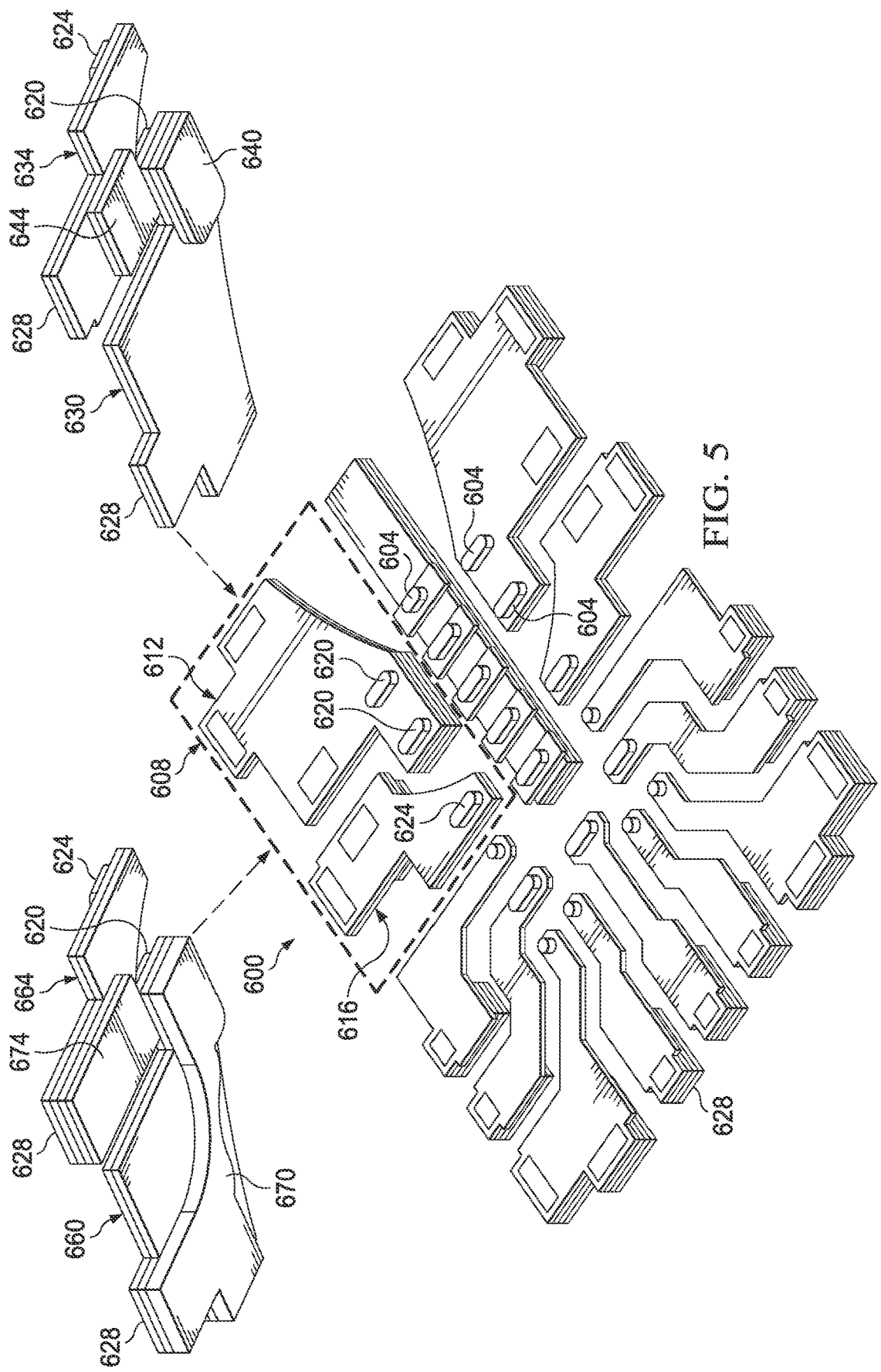
FIG. 5 illustrates views of a three-dimensional (3D) model of a multi-layer package substrate for a die with a power converter module.

FIG. 5 illustrates a three-dimensional (3D) model of a multi-layer package substrate 600 for a semiconductor device, wherein a die and molding (packaging) have been made transparent to illustrate details of the multi-layer package substrate 600. The multi-layer package substrate 600 includes ports 604 that represent connections with the die, only some of which are labeled. The multi-layer package substrate 600 is employable to implement the multi-layer package substrate 108 of FIG. 1 and/or the multi-layer package substrate 208 of FIG. 2. Additionally or alternatively, the multi-layer package substrate 600 can be modified/adjusted to accommodate specific design parameters.

A partition 608 of the multi-layer package substrate 600 represents a portion of the multi-layer package substrate 600 that provides a connection between a power converter module (e.g., the power converter module 216 of FIG. 2) and a PCB (e.g., the PCB 204 of FIG. 2). The partition 608 includes a first electrical path 612 and a second electrical path 616.

The first electrical path 612 includes ports 620 that represent a connection to an output port of the power converter module. The second electrical path 616 includes a port 624 that represents a connection to a return port of the power converter module. The multi-layer package substrate 600 includes a perimeter 628 that defines a boundary of the semiconductor device.

For purposes of illustration, the diagram of the multi-layer package substrate 600 includes a second view of two different examples for implementing the first electrical path 612 and the second electrical path 616. These second views illustrate examples of a portion of an underside of the multi-layer package substrate 600.

The first example includes a first electrical path 630 and a second electrical path 634 that are employable to respectively implement the first electrical path 612 and the second electrical path 616. The multi-layer package substrate 600 includes four (4) layers. Thus, the first example of the first electrical path 630 and the second electrical path 634 also include four (4) layers. The first electrical path 630 includes a stack of conductive components (e.g., traces and vias) that couple the ports 620 to a first pad 640. As illustrated by the first electrical path 630 of the first example, a linear path is formed between the ports 620 and the first pad 640. Furthermore, the second electrical path 634 includes a stack of conductive components (e.g., traces and vias) that couple the port 624 to a second pad 644. As illustrated, both the first pad 640 and the second pad 644 are considered to be island pads that do not intersect the perimeter 628 of the multi-layer package substrate 600.

The second example includes a first electrical path 660 and a second electrical path 664 that are employable to respectively implement the first electrical path 612 and the second electrical path 616. As noted, the multi-layer package substrate 600 includes four (4) layers such that the second example of the first electrical path 660 and the second electrical path 664 also include four (4) layers. The first electrical path 660 includes a stack of conductive components (e.g., traces and vias) that couple the ports 620 to a first pad 670. As illustrated by the first electrical path 660 of the first example, a linear path is formed between the ports 620 and the first pad 670. Furthermore, the second electrical path 634 includes a stack of conductive components (e.g., traces and vias) that couple the port 624 to a second pad 674. As illustrated, both the first pad 640 and the second pad 644 and the second pad 674 include portions that extend from an interior of the multi-layer package substrate 600 to a perimeter 628 of the multi-layer package substrate 600. As comparison to the first pad 640 and the second pad 644 of the first example, the first pad 670 and the second pad 674 of the second example are enlarged to increase surface area and current flow. Increasing the surface area further curtails EMI induced by operation of the power converter module.

Figure 6:
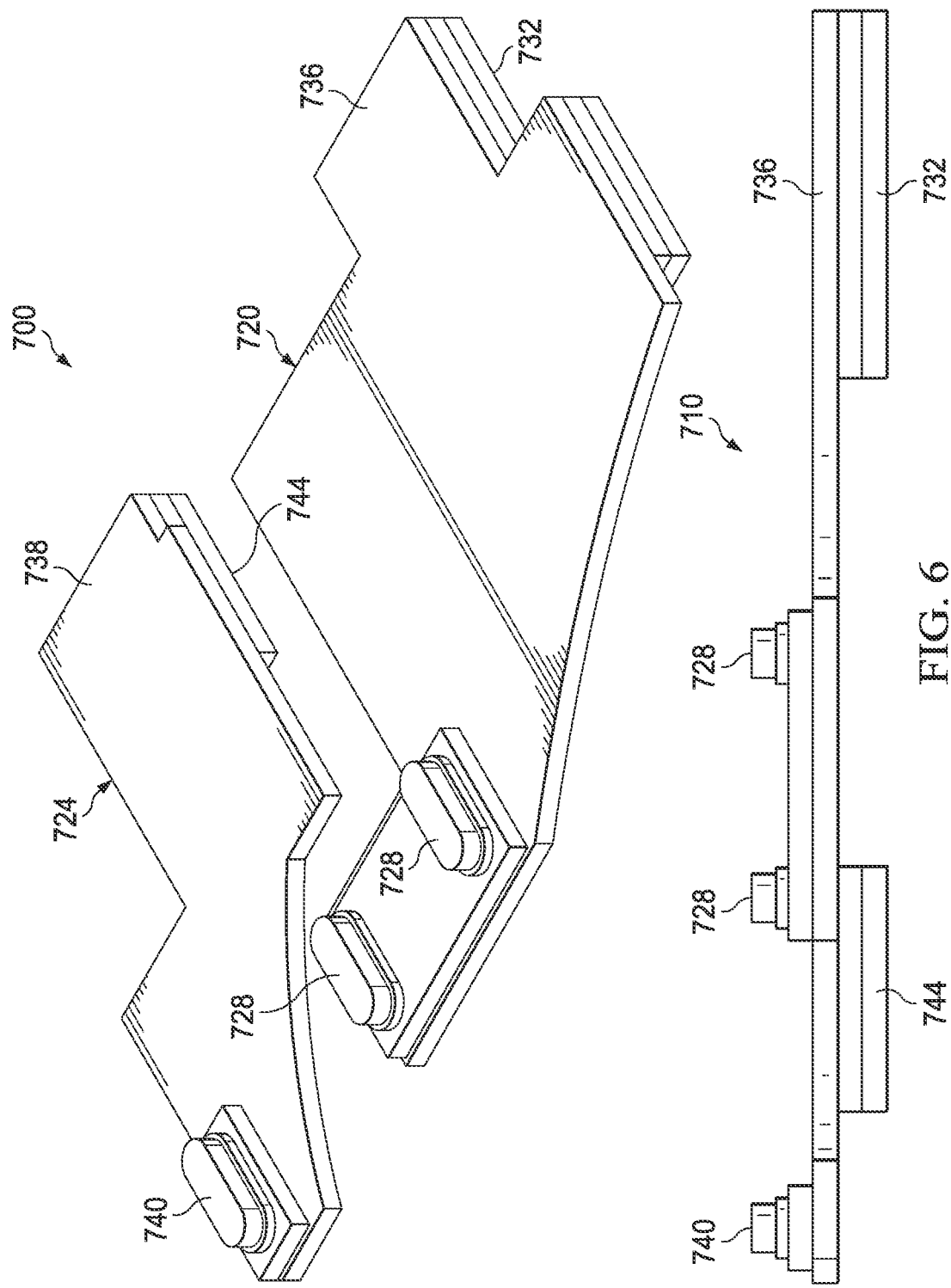
FIG. 6 illustrates views of a 3D model of a first electrical path and a second electrical path for a multi-layer package substrate of a die with a power converter module.

FIG. 6 illustrates another example of a first view 700 and a second view 710 of a first electrical path 720 and a second electrical path 724 that are employable respectively as the first electrical path 612 of FIG. 5 and the second electrical path 616 of FIG. 5. The first electrical path 720 and the second electrical path 724 are employable to implement the first electrical path 428 and the second electrical path 436 of FIG. 4. Additionally, the first electrical path 720 and the second electrical path 436 can be modified/adjusted to accommodate specific design parameters.

In the example illustrated in the first view 700 and the second view 710, the first electrical path 720 includes a stack of vias and traces that provide a conductive path between ports 728 that correspond to the ports 620 of FIG. 6 and a first pad 732 for a multi-layer package substrate (the multi-layer package substrate 600 of FIG. 6). Moreover, in the example illustrated, the first electrical path 720 includes a first trace 736 that extends from a region underlying the ports 728 to a region overlaying the first pad 732. Similarly, the second electrical path 724 also includes a stack of traces and vias that provide a conductive path between a port 740 that corresponds to the port 624 of FIG. 6 and a second pad 744. More particularly, the second electrical path 724 also includes a second trace 738 that underlies a region that includes the port 740 and extends to a region that includes the second pad 744. By providing the first trace 736 and the second trace 738 on layers other than a top layer of the multi-layer package substrate, the first electrical path 720 and the second electrical path 724 curtail EMI induced by operation of a corresponding power converter. In other examples, other processing techniques are employable to provide a conductive path between ports 728 and the first pad 732 and/or the port 740 and the second pad 744. For instance, in some examples, coupled metals are employable to connect die bumps to a PCB to enable the conductive paths.

FIGS. 7-15 illustrate stages of a method for fabricating a multi-layer package substrate, such as the multi-layer package substrate 108 of FIG. 1, the multi-layer layer package substrate 208 of FIG. 2, the multi-layer package substrate 408 of FIG. 3 or the multi-layer package substrate 600 of FIG. 6. The method of FIGS. 7-15 illustrates how multiple layers (four layers) of material are employable to provide the multi-layer package substrate. Moreover, a similar method can be employed to provide other types of connector assemblies.

Figure 7:
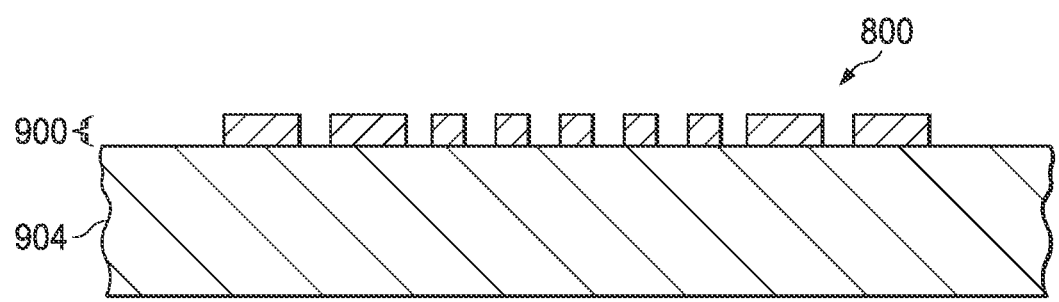
FIG. 7 illustrates a first stage of a method for forming a multi-layer package substrate.
Figure 8:
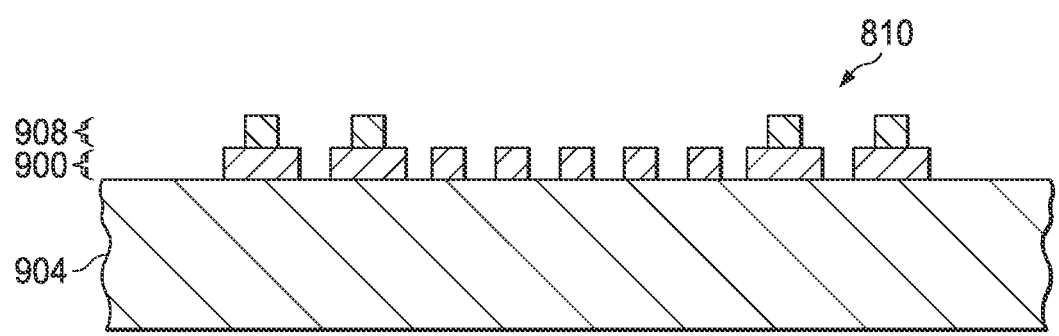
FIG. 8 illustrates a second stage of a method for forming the multi-layer package substrate.
Figure 9:
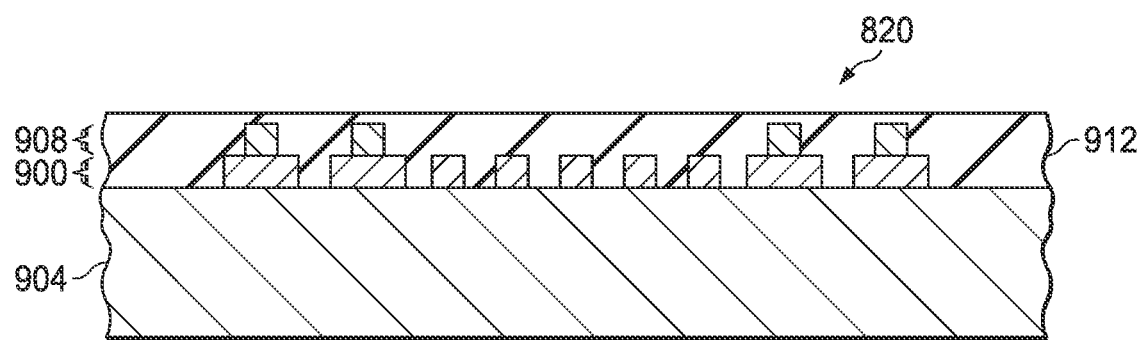
FIG. 9 illustrates a third stage of a method for forming the multi-layer package substrate.
Figure 10:
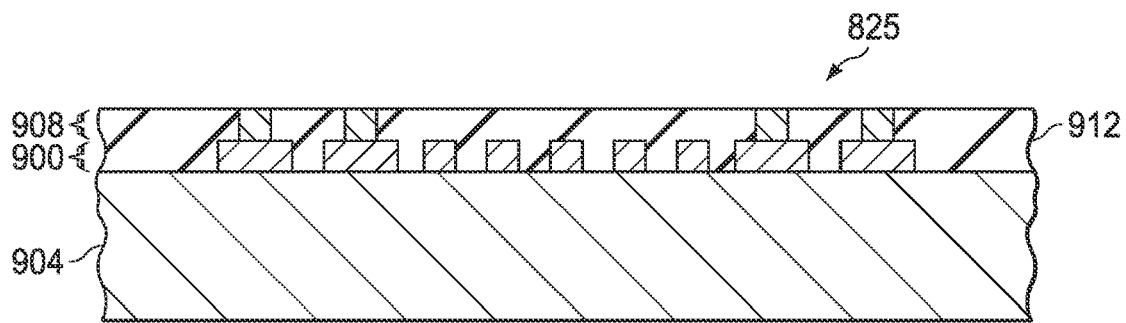
FIG. 10 illustrates a fourth stage of a method for forming the multi-layer package substrate.

As illustrated in FIG. 7, at 800, in a first stage, a first metal layer pattern 900 is plated on a metal carrier 904 to form a first layer of the multi-layer package substrate. As illustrated in FIG. 8, in a second stage, at 810, pillars 908 (e.g., copper pillars or pillars formed of other metal) are plated on the first metal layer pattern 900. As illustrated in FIG. 9, at 820, in a third stage, a first dielectric layer 912 is applied in a compressed molding operation to the pillars 908 and to the first metal layer pattern 900. As illustrated in FIG. 10, in a fourth stage, at 825, a portion of the first dielectric layer 912 is removed in a grinding operation, such that regions of the pillars 908 are exposed, and a second layer of the multi-layer package substrate is formed.

Figure 11:
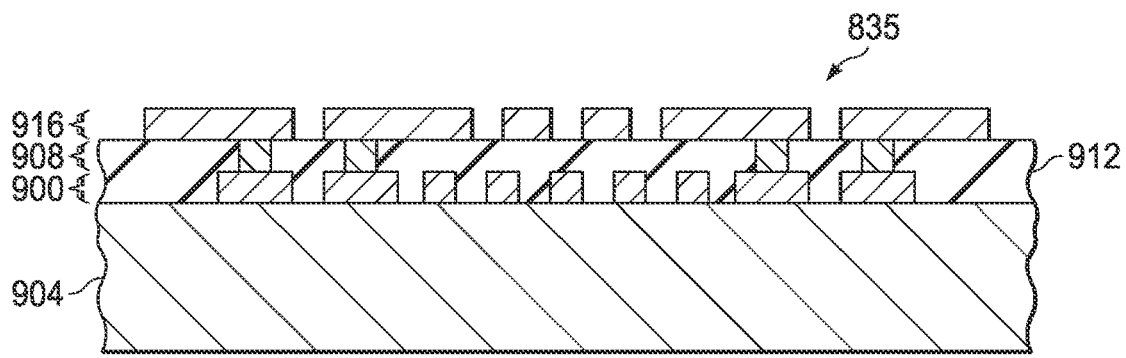
FIG. 11 illustrates a fifth stage of a method for forming the multi-layer package substrate.
Figure 12:
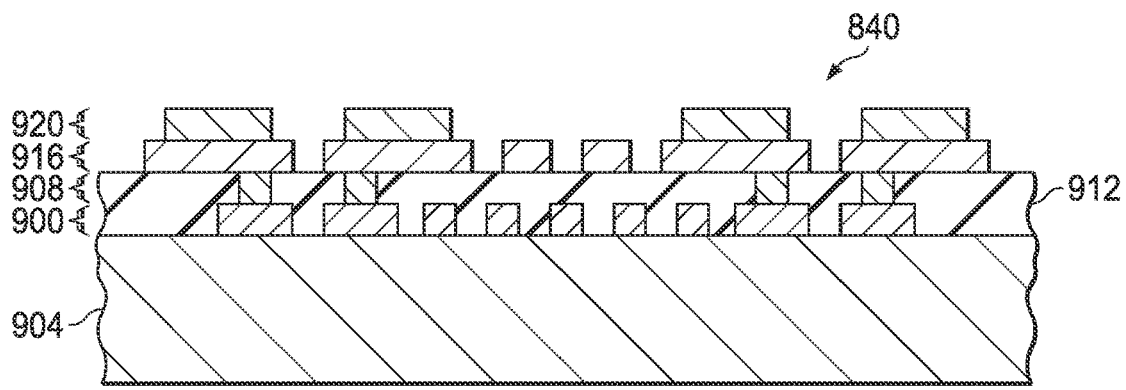
FIG. 12 illustrates a sixth stage of a method for forming the multi-layer package substrate.
Figure 13:
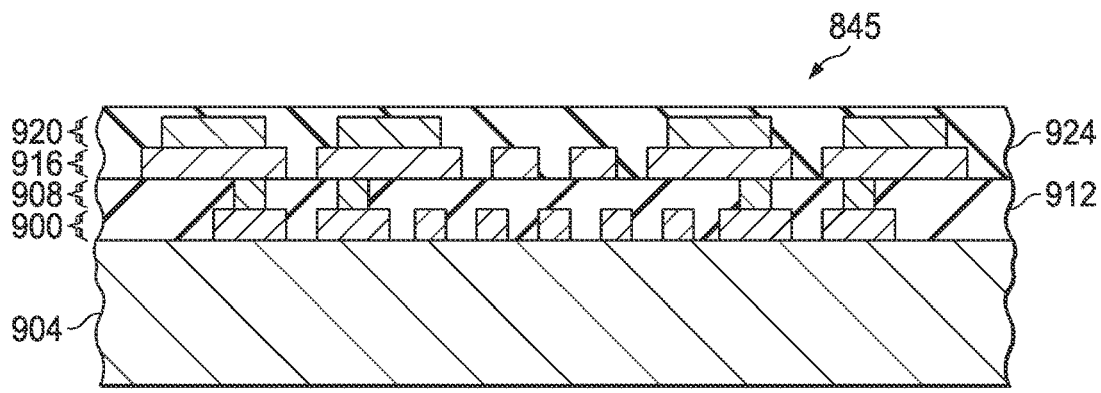
FIG. 13 illustrates a seventh stage of a method for forming the multi-layer package substrate.
Figure 14:
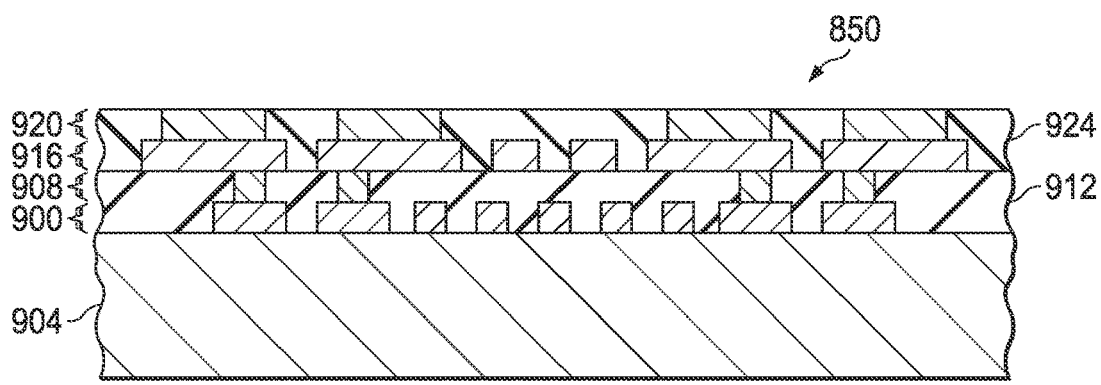
FIG. 14 illustrates an eighth stage of a method for forming the multi-layer package substrate.
Figure 15:
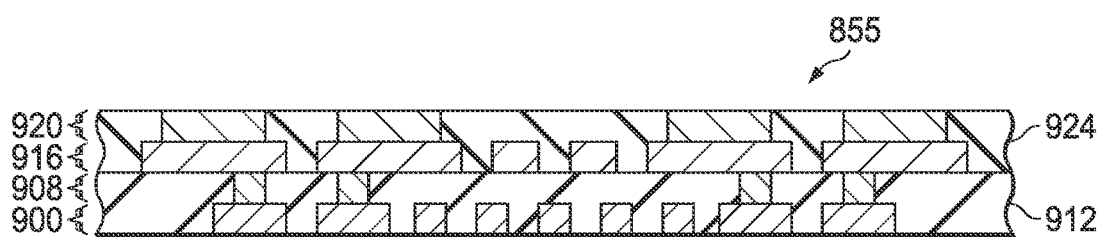
FIG. 15 illustrates a ninth stage of a method for forming the multi-layer package substrate.

As illustrated in FIG. 11, in a fifth stage, at 835, a second metal layer pattern 916 is plated on the first dielectric layer 912 of the second layer of the multi-layer package substrate to form a third layer of the multi-layer package substrate. As illustrated in FIG. 12, in a sixth stage, at 840 pillars 920 (e.g., copper pillars or pillars formed of other metal) are applied to the second metal layer pattern 916. As illustrated in FIG. 13, in a seventh stage, at 845 a second dielectric layer 924 is applied in a compressed molding operation to the pillars 920 and to the second metal layer pattern 916. As illustrated in FIG. 14, in an eight stage, at 850, a portion of the second dielectric layer 924 is removed in a grinding operation, such that regions of the pillars 920 are exposed, and a fourth layer of the multi-layer package substrate is formed. As illustrated in FIG. 15, in a ninth stage, at 855, the metal carrier 904 is removed in a de-carrier operation. The de-carrier operation executed at 855 exposes a region of the first metal layer pattern 900. As illustrated in FIGS. 7-15, by implementing the method, the resultant four layers of the multi-layer package substrate are employable to provide relatively complex electrical paths. In particular, as illustrated in FIGS. 7-15, the first dielectric layer 912 and the second dielectric layer 924 are formed (pre-molded) prior to mounting a die on the multi-layer package substrate. Such a pre-molding operation distributes dielectric throughout the multi-layer package substrate and enables the complexities of signal paths described herein. For instance, in one example, a first portion of the first metal plating pattern 904 and the second metal plating pattern 916 are employable to form a first electrical path, such as the first electrical path 228 of FIG. 2. Similarly, a second portion of the first metal plating pattern 904 and the second plating pattern 916 are employable to form a second electrical path, such as the second electrical path 236 of FIG. 2.

Figure 16:
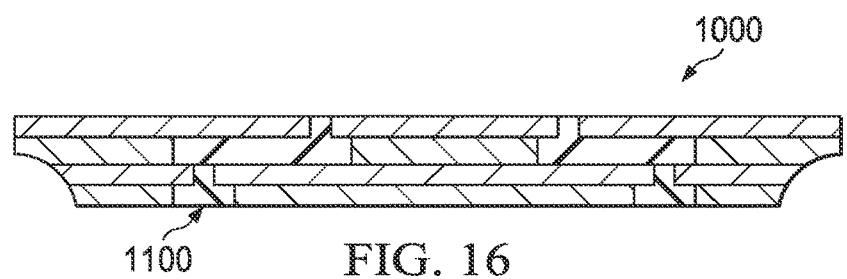
FIG. 16 illustrates a first stage of packaging to form a semiconductor device.
Figure 17:
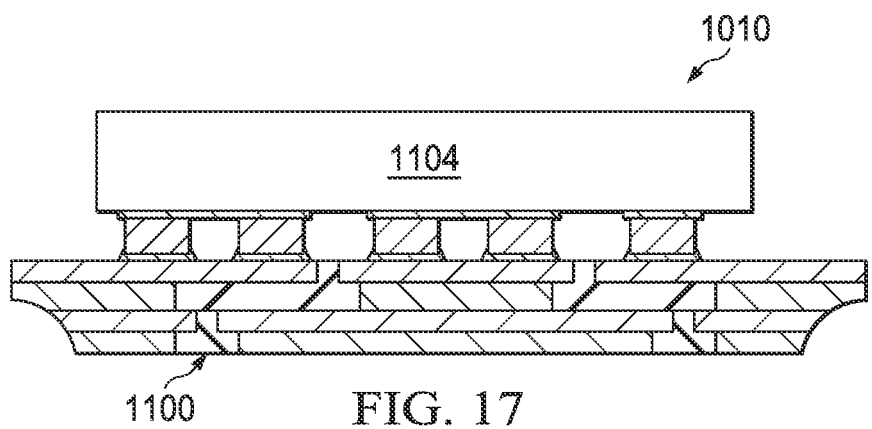
FIG. 17 illustrates a second stage of packaging to form the semiconductor device.
Figure 18:
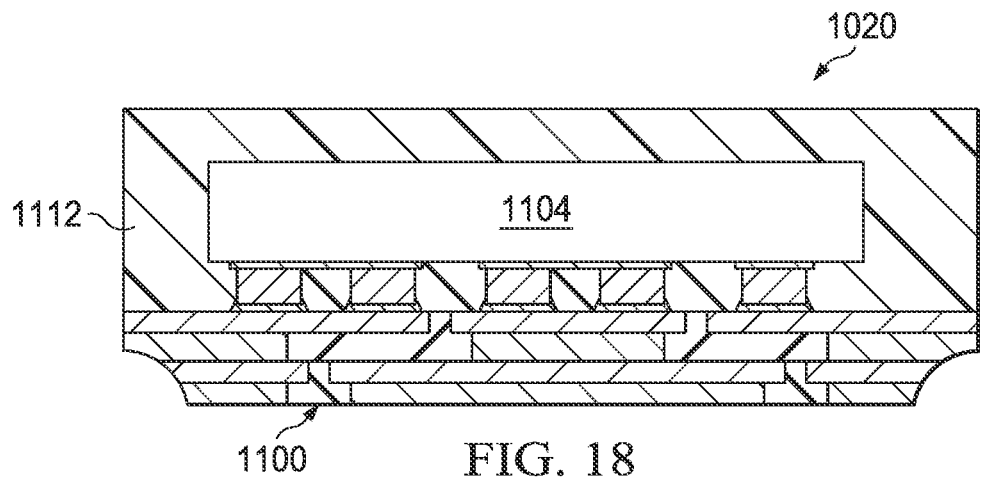
FIG. 18 illustrates a third stage of packaging to form the semiconductor device.

FIG. 16-18 illustrate stages of a method for packaging a semiconductor device (e.g., an IC chip). The semiconductor device formed by the method of FIGS. 16-18 is employable to implement the semiconductor device 100 of FIG. 1, the semiconductor device 200 of FIG. 2 and/or the semiconductor device 400 of FIG. 4. As illustrated in FIG. 16, in a first stage, at 1000, a multi-layer package substrate 1100 is provided. As one example, the multi-layer package substrate 1100 is formed with the method illustrated in FIGS. 7-15. As illustrated in FIG. 17, in a second stage, at 1010 a die 1104 is mounted on (adhered to) the multi-layer package substrate 1100 in a soldering operation. The die includes a power converter module. As illustrated in FIG. 18, in a third stage, at 1020, a molding 1112 is applied to the die 1104 and the multi-layer package substrate 1100 in a packaging operation to form the semiconductor device 1120.

As demonstrated in FIGS. 16-18, in the method illustrated, the multi-layer package substrate 1100 is pre-molded with dielectric for the die 1104. That is, the dielectric is distributed throughout the multi-layer package substrate 1100. Accordingly, adhering the die 1104 does not require application of a dielectric material to keep the positions of the layers in the multi-layer package substrate 1100 static.

Figure 19:
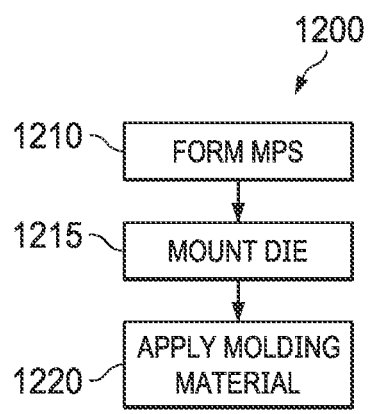
FIG. 19 illustrates a flowchart of an example method for forming a semiconductor device.

FIG. 19 illustrates a flowchart of an example method 1200 for forming a semiconductor device (e.g., an IC package). The method 1200 could be employed for example, to form the semiconductor device 100 of FIG. 1, the semiconductor device 200 of FIG. 2 and/or the semiconductor device 400 of FIG. 4. At 1210, a multi-layer package substrate (e.g., the multi-layer package substrate 108 of FIG. 1) or other type of connector assembly can be formed. The multi-layer package substrate 1210 can be formed, for example, with the method illustrated in FIGS. 7-15. The multi-layer package substrate can include layers that includes dielectric distributed throughout the multi-layer package substrate (as illustrated in FIGS. 15 and 18). The layers of the multi-layer package substrate form a first electrical path between a first trace and a first pad of pads of the multi-layer package substrate and a second electrical path between a second trace and a second pad of the pads of the multi-layer package substrate.

At 1215, a die (e.g., the die 112 of FIG. 1) is mounted to the multi-layer package substrate, the die includes a power converter module (e.g., the power converter module 116 of FIG. 1) that includes an output port and a return port at a surface of the die. The output port is configured to be coupled to the first trace of the multi-layer package substrate. The return port being configured to be coupled to the second trace of the of multi-layer package substrate. The first electrical path extends in a direction normal to the surface of the die for a distance greater than a thickness of a single layer of the multi-layer package substrate. At 1220, molding material is applied to the die and the multi-layer package substrate to form the semiconductor device.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims.

What is claimed is:

1. A semiconductor device comprising:
a die comprising a power converter module, wherein the power converter module includes an output port and a return port;
a connection assembly comprising:
pads abutting a surface of the semiconductor device;
a first layer patterned to include a first trace that is directly coupled to one of the output port and the return port of the power converter module and a second trace that is directly coupled to the other of the output port and return port of the power converter module;
a second layer patterned to provide a first via between the first trace and a third layer of the connection assembly and a second via between the second trace and the third layer of the connection assembly; and
the third layer of the connection assembly being patterned to provide a portion of a first conductive path between the first via and a first pad of the pads and a portion of a second conductive path between the second via and a second pad of the pads.

2. The semiconductor device of claim 1, wherein when the pads are coupled to circuit components of a printed circuit board (PCB), the PCB provides a third conductive path between the first pad of the pads and the second pad of the pads that completes a circuit path between the output port and the return port of the power converter module and an area circumscribed by the circuit path between the output port and the return port of the power converter module defines a loop area for the power converter module.

3. The semiconductor device of claim 2, wherein the first conductive path and the second conductive path of the connection assembly are parallel paths.

4. The semiconductor device of claim 3, wherein the die comprises a surface and the output port and the return port of the power converter module are situated on the surface of the die and the first conductive path and the second conductive path extend in a direction normal to the surface of the die.

5. The semiconductor device of claim 4, wherein the first pad of the pads and the second pad of the pads are spaced apart from a perimeter of the connection assembly.

6. The semiconductor device of claim 4, wherein the first pad extends from a region spaced apart from a perimeter of the connection assembly.

7. The semiconductor device of claim 4, wherein a first electrical path formed between the first trace of the first layer of the connection assembly and the first pad of the pads and a second electrical path formed between the second trace of the first layer of the connection assembly and the second pad of the pads are substantially linear.

8. The semiconductor device of claim 2, wherein the die comprises a surface and the output port and the return port of the power converter module are situated on the surface of the die and the first conductive path extends in a direction parallel to the surface of the die and the second conductive path extends in a direction normal to the surface of the die.

9. The semiconductor device of claim 2, wherein the power converter module is a buck converter or a boost converter.

10. The semiconductor device of claim 2, wherein the power converter module is an alternating current (AC) to direct current (DC) converter.

11. The semiconductor device of claim 2, wherein the PCB comprises an inductor and a load coupled between the first pad of the pads and the second pad of the pads of the connection assembly.

12. A semiconductor device comprising:
a die comprising a surface and a power converter module, wherein the power converter module includes an output port and a return port on the surface of the die;
a connection assembly comprising:
pads configured to be coupled to circuit components of a printed circuit board (PCB);

a first layer patterned to include a first trace that is coupled to one of the output port and the return port of the power converter module and a second trace that is coupled to the other of the output port and return port of the power converter module;

a second layer patterned to provide a first via between the first trace and a third layer of the connection assembly and a second via between the first trace and the third layer of the connection assembly, the third layer of the connection assembly being patterned to provide a portion of a first conductive path between the first via and a first pad of the pads and a portion of a second conductive path between the second via and a second pad of the pads, wherein the first conductive path extends in a direction parallel to the surface of the die and the second conductive path extends in a direction normal to the surface of the die;

wherein when the pads are coupled to circuit components of the printed circuit board (PCB), the PCB provides a third conductive path between the first pad of the pads and the second pad of the pads that completes a circuit path between the output port and the return port of the power converter module and an area circumscribed by the circuit path between the output port and the return port of the power converter module defines a loop area for the power converter module; and wherein the first layer of the connection assembly and the second layer of the connection assembly have a combined thickness greater than a thickness of the third layer of the connection assembly that includes the first conductive path.

13. The semiconductor device of claim 12, wherein the first pad and the second pad of the pads are situated at a perimeter of the connection assembly.

14. The semiconductor device of claim 12, wherein the first conductive path and the second conductive path of the connection assembly are parallel paths.

15. The semiconductor device of claim 14, wherein the die comprises a surface and the output port and the return port of the power converter module are situated on the surface of the die and the first conductive path and the second conductive path extend in a direction normal to the surface of the die.

16. The semiconductor device of claim 15, wherein the first pad of the pads and the second pad of the pads are spaced apart from a perimeter of the connection assembly.

17. The semiconductor device of claim 15, wherein the first pad extends from a region spaced apart from a perimeter of the connection assembly.

18. The semiconductor device of claim 17, wherein a first electrical path formed between the first trace of the first layer of the connection assembly and the first pad of the pads and a second electrical path formed between the second trace of the first layer of the connection assembly and the second pad of the pads are substantially linear.

19. The semiconductor device of claim 14, wherein the PCB comprises an inductor and a load coupled between the first pad of the pads and the second pad of the pads of the connection assembly.

20. The semiconductor device of claim 12, wherein the die comprises a surface and the output port and the return port of the power converter module are situated on the surface of the die and the first conductive path extends in a direction parallel to the surface of the die and the second conductive path extends in a direction normal to the surface of the die.

21. The semiconductor device of claim 12, wherein the power converter module is a buck converter or a boost converter.

22. The semiconductor device of claim 12, wherein the power converter module is an alternating current (AC) to direct current (DC) converter.

23. The semiconductor device of claim 12, wherein the PCB comprises an inductor and a load coupled between the first pad of the pads and the second pad of the pads of the connection assembly.

* * * * *